(12) United States Patent
Goto et al.

(10) Patent No.: US 10,931,256 B2
(45) Date of Patent: Feb. 23, 2021

(54) JOINED BODY AND ELASTIC WAVE ELEMENT

(71) Applicant: NGK INSULATORS, LTD., Nagoya (JP)

(72) Inventors: Masashi Goto, Nagoya (JP); Tomoyoshi Tai, Inazawa (JP); Mai Minoura, Kasugai (JP)

(73) Assignee: NGK INSULATORS, LTD., Nagoya ( * ) Notice: Subject to any disclaimer, the term of this patent is extended or adjusted under 35 U.S.C. 154(b) by 0 days.

(21) Appl. No.: 16/797,648

(22) Filed: Feb. 21, 2020

(65) Prior Publication Data
US 2020/0195218 A1    Jun. 18, 2020

Related U.S. Application Data

(63) Continuation of application No. PCT/JP2018/030855, filed on Aug. 21, 2018.

(30) Foreign Application Priority Data

Aug. 25, 2017 (JP) .............................. JP2017-162241

(51) Int. Cl.
*H03H 9/02* (2006.01)
*H03H 9/25* (2006.01)

(52) U.S. Cl.
CPC .... *H03H 9/02826* (2013.01); *H03H 9/02559* (2013.01); *H03H 9/25* (2013.01)

(58) Field of Classification Search
CPC combination set(s) only.
See application file for complete search history.

(56) References Cited

U.S. PATENT DOCUMENTS 7,213,314 B2    5/2007   Abbott et al.
9,776,924 B2   10/2017   Isoda et al.
(Continued)

FOREIGN PATENT DOCUMENTS

JP    2000312130 A    11/2000
JP    2006-058180 A    3/2006
(Continued)

OTHER PUBLICATIONS

Japanese International Search Report with English translation for corresponding PCT/JP2018/030855, dated Mar. 5, 2020 (11 pages).

(Continued)

*Primary Examiner* — Bryan P Gordon
(74) *Attorney, Agent, or Firm* — Flynn Thiel, P.C.

(57) ABSTRACT

A bonded body includes a supporting substrate and piezoelectric material layer. The supporting substrate is composed of sialon. The material of the piezoelectric material layer is $LiAO_3$ (A represents one or more element selected from the group consisting of niobium and tantalum). It is included an interface layer present along an interface between the supporting body and piezoelectric material layer and a supporting substrate-side intermediate layer present between the interface layer and supporting substrate. Each of the interface layer and supporting substrate-side intermediate layer contains nitrogen, oxygen, aluminum, silicon and one or more element selected from the group consisting of niobium and tantalum as main components.

7 Claims, 5 Drawing Sheets

(56) References Cited

U.S. PATENT DOCUMENTS

| | | |
|---|---|---|
| 10,049,951 B2 | 8/2018 | Konishi et al. |
| 2004/0226162 A1 | 11/2004 | Miura et al. |
| 2010/0019325 A1* | 1/2010 | Nakamura .......... H01L 29/7843 |
| | | 257/369 |
| 2010/0132775 A1* | 6/2010 | Le .................... H01L 31/048 |
| | | 136/255 |
| 2010/0182101 A1 | 7/2010 | Suzuki |
| 2012/0086312 A1 | 4/2012 | Kobayashi et al. |
| 2013/0099243 A1* | 4/2013 | Chen ................ H01L 21/0262 |
| | | 257/76 |
| 2014/0084753 A1* | 3/2014 | Shibuya .............. H02N 2/0085 |
| | | 310/365 |
| 2014/0377522 A1* | 12/2014 | Koch, III ................ C03C 3/091 |
| | | 428/213 |
| 2016/0049469 A1 | 2/2016 | Yoshikawa et al. |
| 2017/0179371 A1 | 6/2017 | Kitamura et al. |
| 2019/0036505 A1 | 1/2019 | Akiyama et al. |

FOREIGN PATENT DOCUMENTS

| | | |
|---|---|---|
| JP | 3774782 B2 | 5/2006 |
| JP | 2010-187373 A | 8/2010 |
| JP | 2012213244 A | 11/2012 |
| JP | 2014-086400 A | 5/2014 |
| JP | 2014-147054 A | 8/2014 |
| JP | 5814727 B2 | 11/2015 |
| WO | 2014/192597 A1 | 12/2014 |
| WO | 2015186560 A1 | 12/2015 |
| WO | 2016-052597 A1 | 4/2016 |
| WO | 2017/047604 A1 | 3/2017 |
| WO | 2017/134980 A1 | 8/2017 |
| WO | 2019039474 A | 2/2019 |

OTHER PUBLICATIONS

Japanese International Search Opinion with English translation for corresponding PCT/JP2018/030853, dated Mar. 5, 2020 (14 pages).

Notice of Reasons for Revocation with English translation for corresponding JP Application No. 2019-093433, dated Jan. 23, 2020 (12 pages).

Japanese International Search Report for corresponding PCT/JP2018/030855, dated Oct. 30, 2018 (3 pages).

Japanese Written Opinion for corresponding PCT/JP2018/030855, dated Oct. 30, 2018 (3 pages).

English Decision to Grant a Patent 6507326B (Application No. 2018-566333) (2 pages).

* cited by examiner

JOINED BODY AND ELASTIC WAVE ELEMENT

CROSS-REFERENCE TO RELATED APPLICATIONS

This is a continuation of PCT/JP2018/030855, filed Aug. 21, 2018, which claims priority to Japanese Application No. 2017-162241, filed Aug. 25, 2017, the entire contents of which are hereby incorporated by reference.

TECHNICAL FIELD

The present invention relates to a bonded body of a specific piezoelectric material layer and a supporting substrate of sialon.

BACKGROUND ARTS

A surface acoustic wave device functioning as a filter device or oscillator used in mobile phones or the like, and an acoustic wave device such as lamb wave device or film bulk acoustic resonator (FBAR) using a piezoelectric thin film, are known. A device produced by adhering a supporting substrate and a piezoelectric substrate propagating a surface acoustic wave and by providing interdigitated electrodes capable of oscillating the surface acoustic wave on a surface of the piezoelectric substrate is known as an acoustic wave device. By adhering the supporting substrate whose thermal expansion coefficient is lower than that of the piezoelectric substrate onto the piezoelectric substrate, the change of the size of the piezoelectric substrate responsive to temperature change is reduced so that the change of the frequency characteristics as the surface acoustic wave device is reduced.

For example, patent document 1 proposes a surface acoustic wave device having the structure produced by adhering a piezoelectric substrate and silicon substrate with an adhesive layer composed of an epoxy adhering agent.

Here, it is known that, when bonding a piezoelectric substrate and silicon substrate, a silicon oxide film is formed on a surface of the piezoelectric substrate and the silicon substrate and the piezoelectric substrate are bonded through the silicon oxide film (patent document 2). A plasma beam is irradiated onto the surfaces of the silicon oxide film and silicon substrate to activate the surfaces, followed by the direct bonding (by a plasma activation method).

Further, providing a filler layer on a roughened surface of the piezoelectric substrate to provide a flattened surface, and adhering the filler layer onto a silicon substrate through an adhering layer, is known (patent document 3). According to this method, an epoxy-based or acryl-based resin is used for the filler layer and adhering layer, and the bonding surface of the piezoelectric substrate is roughened to reduce the reflection of bulk wave and to reduce spurious wave.

Further, a direct bonding method using the so-called FAB (Fast Atom Beam) system is known (patent document 4). According to this method, a neutralized atomic beam is irradiated onto the respective bonding surfaces at ambient temperature to activate them, followed by the direct bonding.

On the other hand, according to patent document 5, a piezoelectric material layer is directly bonded to a supporting substrate made of a ceramic material (alumina, aluminum nitride, silicon nitride) and not to a silicon substrate, through an intermediate layer. The material of the intermediate layer is silicon, silicon oxide, silicon nitride or aluminum nitride.

PRIOR TECHNICAL DOCUMENTS

Patent Documents (Patent document 1) Japanese patent publication No. 2010-187373A
(Patent document 2) U.S. Pat. No. 7,213,314 B2
(Patent document 3) Japanese Patent No. 5, 814, 727B
(Patent document 4) Japanese Patent Publication No. 2014-086400A
(Patent document 5) U.S. Pat. No. 3,774,782B

SUMMARY OF THE INVENTION

The inventors have researched bonding a supporting substrate, particularly composed of sialon, onto a piezoelectric material layer composed of lithium niobate or lithium tantalate strongly and stably. The reason for this is that it is preferred to thin the piezoelectric material layer by polishing after the supporting substrate is bonded to the piezoelectric material layer from the viewpoint of performance and that fine separation occurs during the polishing if the bonding strength is low.

However, it proved to be difficult to bond the piezoelectric material layer composed of lithium niobate or lithium tantalate onto the supporting substrate composed of sialon strongly and stably.

An object of the present invention is to provide a microstructure capable of bonding the piezoelectric material layer composed of lithium niobate or lithium tantalate onto the supporting substrate composed of sialon strongly and stably.

The present invention provides a bonded body comprising a supporting substrate and a piezoelectric material layer, said supporting substrate comprising sialon, and the piezoelectric material layer comprising a material comprising $LiAO_3$ (A represents one or more element selected from the group consisting of niobium and tantalum):

wherein the bonded body comprises an interface layer present along an interface between the supporting substrate and the piezoelectric material layer and a supporting substrate-side intermediate layer present between the interface layer and said supporting substrate; and wherein each of the interface layer and said supporting substrate-side intermediate layer comprises nitrogen, oxygen, aluminum, silicon and one or more element selected from the group consisting of niobium and tantalum.

The present invention further provides an acoustic wave device comprising:
the bonded body; and
an electrode provided on the piezoelectric material layer.

According to the present invention, it is successfully provided the microstructure in which the piezoelectric material layer composed of lithium niobate or lithium tantalate can be bonded onto the supporting substrate composed of sialon strongly and stably.

EMBODIMENTS FOR CARRYING OUT THE INVENTION

Figure 1A:
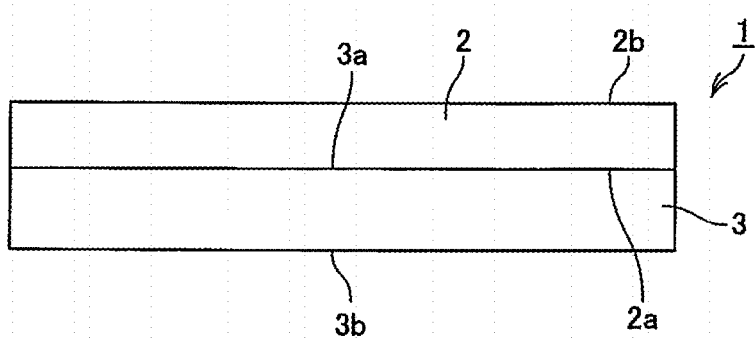
FIG. 1(a) is a diagram schematically showing a bonded body 1 according to an embodiment of the present invention.

The present invention will be described in detail below, appropriately referring to attached drawings.

The bonded body of the present invention includes a supporting substrate and a piezoelectric material layer, the supporting substrate is composed of sialon, and the piezoelectric material substrate is made of a material of $LiAO_3$ (A represents one or more element selected from the group consisting of niobium and tantalum). For example, according to a bonded body 1 shown in FIG. 1(a), an activated surface 2a of a piezoelectric material layer 2 is bonded to an activated surface 3a of a supporting substrate 3 by direct bonding. Further, 2b represents a main surface of the piezoelectric material layer 2 and 3b represents a main surface of the supporting substrate 3.

Figure 1B:
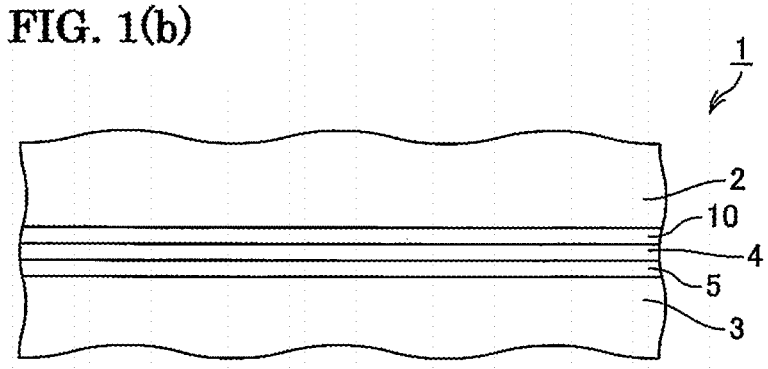
FIG. 1(b) is an enlarged view of an essential part of the bonded body 1.

Here, a bonding interface of the bonded body of FIG. 1(a) is enlarged and shown as a schematic diagram in FIG. 1(b).

According to the present example, an interface layer 4 is provided along an interface between the supporting substrate 3 and piezoelectric material layer 2, a supporting substrate-side intermediate layer 5 is present between the interface layer 4 and supporting substrate 3, and a piezoelectric material layer-side intermediate layer 10 is present between the interface layer 4 and piezoelectric material layer. Each of the interface layer 4, supporting substrate-side intermediate layer 5 and piezoelectric material layer-side intermediate layer 10 is composed of a material containing one or more element selected from the group consisting of niobium and tantalum, nitrogen, oxygen, aluminum and silicon as main components.

The material of the piezoelectric material layer is made $LiAO_3$. Here, A represents one or more elements selected from the group consisting of niobium and tantalum. Thus, $LiAO_3$ may be lithium niobate, lithium tantalate or lithium niobate-lithium tantalate solid solution.

The supporting substrate is composed of sialon. Sialon is a ceramic obtainable by sintering mixture of silicon nitride and alumina, and has the following composition: $Si_{6-z}Al_zO_zN_{8-z}$.

That is, sialon has the composition in which alumina is mixed into silicon nitride, and z indicates a mixing ratio of alumina. z may more preferably be 0.5 or higher. Further, z may more preferably be 4.0 or lower. Further, sialon may preferably be a sintered body, although its manufacturing method is not particularly limited.

The relative density of sialon used in the present invention may preferably be 95.5 percent or higher and may be 100 percent, from the viewpoint of bonding strength. The relative density is to be measured by Archimedes method.

Figure 2:
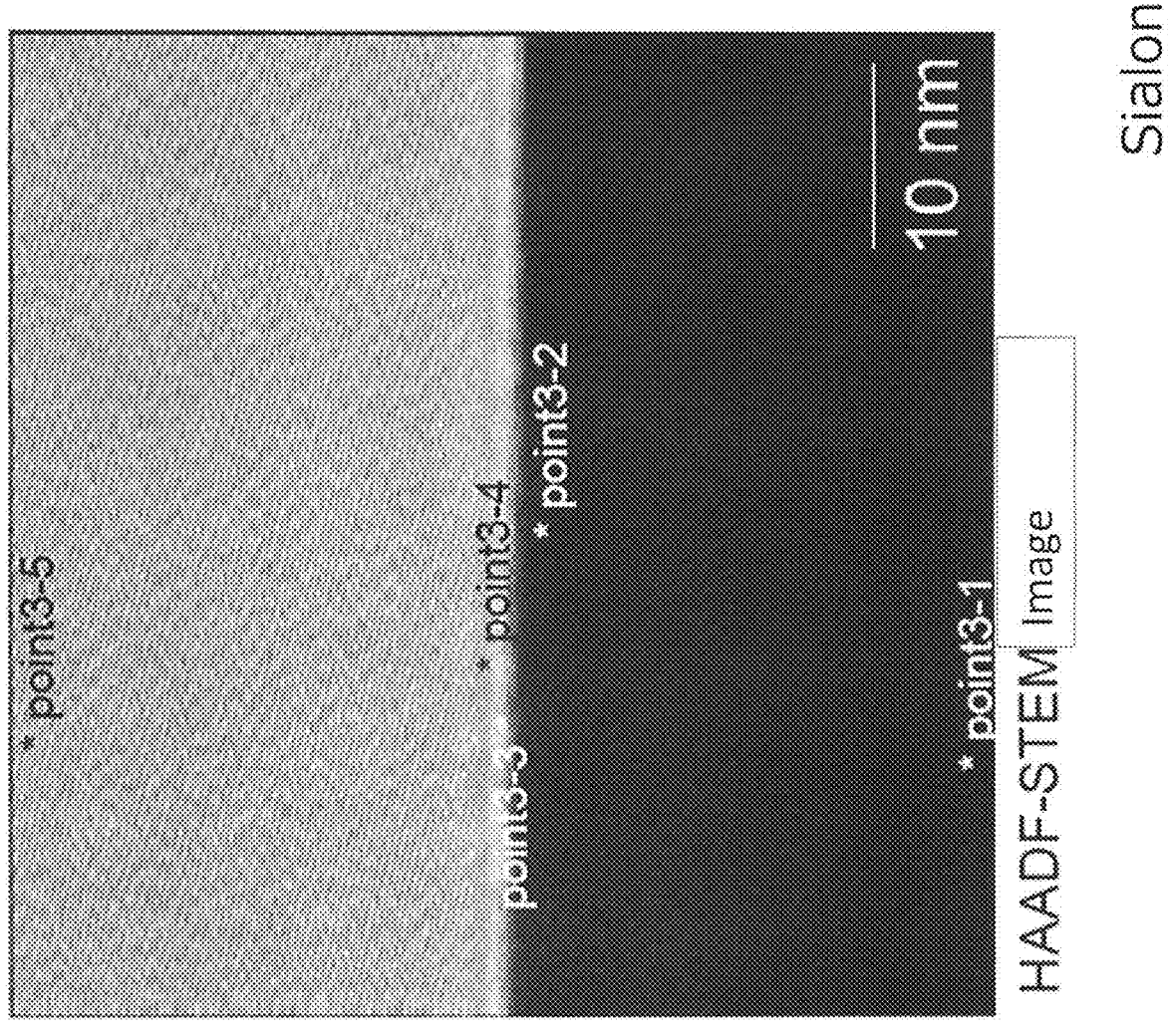
FIG. 2 is a photograph showing an essential part of a bonded body according to an embodiment of the present invention.
Figure 3:
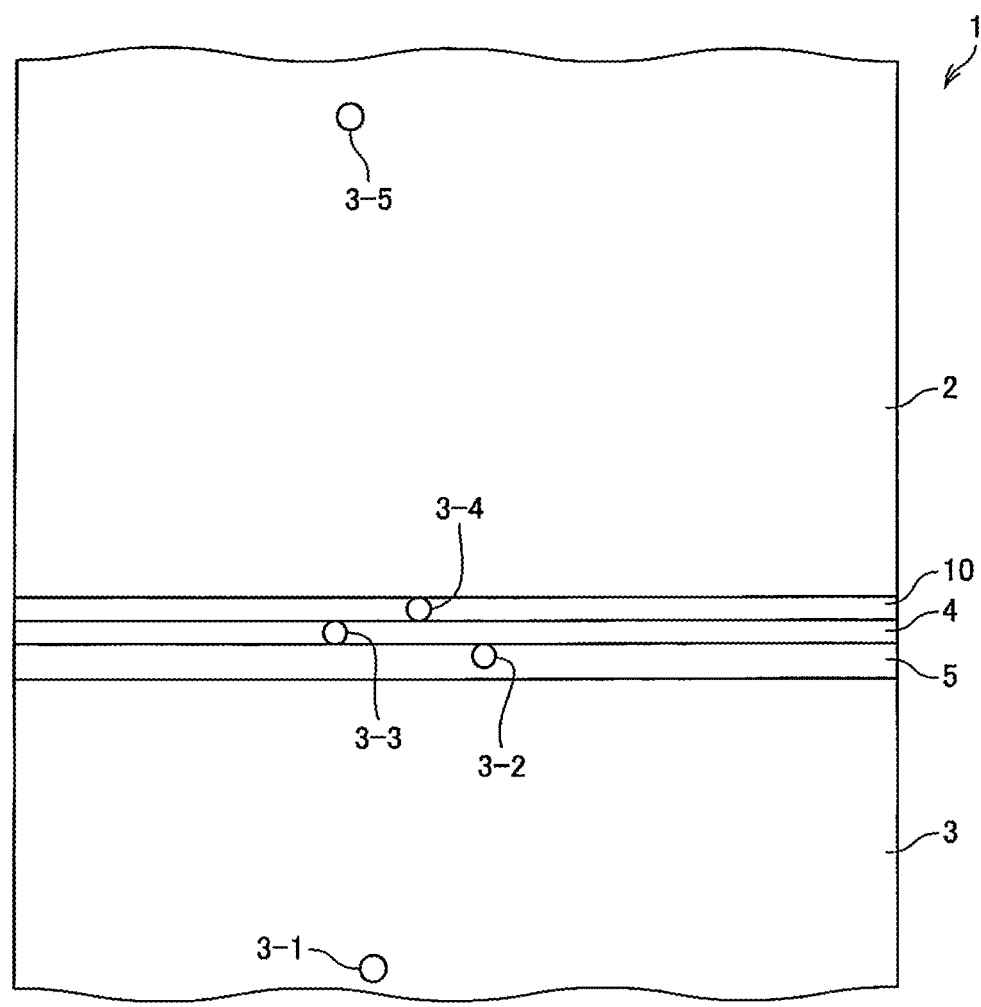
FIG. 3 is a diagram illustrating the photograph of FIG. 2.

The compositions of the respective layers shown in FIGS. 1(b), 2 and 3 are as follows.

Composition of supporting substrate: $Si_{6-z}Al_zO_zN_{8-z}$

Composition of piezoelectric material layer 2: $LiAO_3$ (A=Ta, Nb)

Then, at the stage of directly bonding the supporting substrate 3 and piezoelectric material layer 2, the activation conditions of the respective bonding surfaces are controlled to generate appropriate atomic diffusion along the interface of the both, so the inventive interface layer 4 and supporting substrate-side intermediate layer 5 can be generated. That is, each of the interface layer and supporting substrate-side intermediate layer contains one or more element(s) (A) selected from the group consisting of niobium and tantalum, nitrogen (N), oxygen (O), aluminum (Al) and silicon (Si) as main components. One or more element(s) (A) selected from the group consisting of niobium and tantalum diffuses from the piezoelectric material layer 2 to the side of the supporting substrate 3. Further, nitrogen (N), aluminum (Al) and silicon (Si) also diffuse from the supporting substrate 3 ($Si_{6-z}Al_zO_zN_{8-z}$) to the piezoelectric material layer ($LiAO_3$).

It is found that the piezoelectric material layer composed of lithium niobate or lithium tantalate can be bonded onto the supporting substrate composed of sialon strongly sand stably, by applying this microstructure.

Further, "the material contains one or more element(s) (A) selected from the group consisting of niobium and tantalum, nitrogen (N), oxygen (O), aluminum (Al) and silicon (Si) as main components" means that a total of these elements is 93 atomic percent or higher and may preferably be 95 atomic percent or higher, provided that 100 is assigned to a total of all elements.

The inventors have further researched these compositions in detail and have proved the following. That is, when the nitrogen ratio of the interface layer 4 is higher than the nitrogen ratio of the supporting substrate-side intermediate layer 5, the bonding strength is considerably improved in particular and bulk fracture tends to occur in parts other than the bonding interface.

The reasons are not clear. As nitrogen (N) atoms diffuse from the supporting substrate to the piezoelectric material layer 2, it is conventionally understood that the nitrogen ratio of the supporting substrate-side intermediate layer 5 should be higher than the nitrogen ratio of the interface layer 4. However, the supporting substrate-side intermediate layer and interface layer are very thin, so that the diffusion of nitrogen is facilitated depending on the activation state of each bonding surface. Thus, the diffusion of nitrogen is concentrated in the interface layer 4 slightly distant from the supporting substrate 3. Then, it is found that the bonding strength is considerably improved when such diffusion takes place.

According to a preferred embodiment, for example, as shown in FIGS. 2 and 3, the interface layer 4 and piezoelectric material layer-side intermediate layer 10 are bright and the supporting substrate-side intermediate layer 5 is dark. However, this photograph is a bright-field image taken by a transmission type electron microscope under the following conditions.

Measuring System:

The microstructure is observed using a transmission type electron microscope (supplied by JEOL Ltd., "JEM-ARM200F").

Measurement Conditions:

A sample is thinned by an FIB (Focused Ion Beam) method and observed at an acceleration voltage of 200 kV.

According to the present invention, each of the atomic ratios of the supporting substrate, supporting substrate-side intermediate layer, interface layer, piezoelectric material layer-side intermediate layer and piezoelectric material layer is determined as follows.

Measuring System:

Elemental analysis system (supplied by JEOL Ltd., "JED-2300T").

Measurement Conditions:

A sample is thinned by an FIB (Focused Ion Beam) method and observed at an acceleration voltage of 200 kV, an X-ray take-off angle of 21.9°, a solid angle of 0.98sr, and a capture time of 30 seconds.

Processing of Measured Values:

Atomic ratios of one or more of element(s) (A) selected from the group consisting of niobium and tantalum, nitrogen (N), oxygen (O), aluminum (Al), silicon (Si) and argon (Ar) are measured at the respective parts of the piezoelectric material layer (point 3-5), piezoelectric material layer-side intermediate layer (point 3-4), interface layer (point 3-3), supporting substrate-side intermediate layer (point 3-2) and supporting substrate (point 3-1). The atomic ratio of the element (A) is a total of the ratios of Ta and Nb. At the respective parts, the respective atomic ratios (atom %) of the respective atoms are calculated so that 100% is assigned to a total of the atomic ratios of the respective elements.

Then, the atomic ratios of nitrogen (N), aluminum (Al) and silicon (Si) of the supporting substrate are converted to 100 and, in response to this, the atomic ratios of nitrogen (N), aluminum (Al) and silicon (Si) of the other layers are calculated. These are indications of the diffusion of nitrogen (N), aluminum and silicon from the supporting substrate to the respective layers. In the piezoelectric material layer, the atomic ratios of nitrogen (N), aluminum (Al) and silicon (Si) are 0.

Further, the atomic ratio of one or more element(s) (A) selected from the group of niobium and tantalum of the piezoelectric material layer is converted to 100 and, in response to this, the atomic ratios of the element (A) of the respective layers are calculated. These are indications of the diffusion of the element (A) from the piezoelectric material layer to the respective layers. The atomic ratio of the element (A) of the supporting substrate is 0.

According to the present invention, the nitrogen ratio of the interface layer may be lower than the nitrogen ratio of the supporting substrate-side intermediate layer. However, a difference between the nitrogen ratios of the interface layer and the supporting substrate-side intermediate layer may preferably be 11 or smaller and more preferably be 10 or smaller. Further, according to a preferred embodiment, the nitrogen ratio of the interface layer is made higher than the nitrogen ratio of the supporting substrate-side intermediate layer. In view of this, a difference between the nitrogen ratios of the interface layer and supporting substrate-side intermediate layer may preferably be 2 or larger and more preferably be 7 or larger.

According to a preferred embodiment, the nitrogen ratio of the interface layer is 51 or higher and 93 or lower, provided that 100 is assigned to the nitrogen ratio of the supporting substrate, so that the bonding strength can be further improved. In view of this, the nitrogen ratio of the interface layer may preferably be 60 or higher and 84 or lower, more preferably be 68 or higher and 76 or lower, provided that 100 is assigned to the nitrogen ratio of the supporting substrate.

Further, according to a preferred embodiment, the nitrogen ratio of the supporting substrate-side intermediate layer is 50 or higher and 67 or lower, and more preferably be 56 or higher and 61 or lower, provided that 100 is assigned to the nitrogen ratio of the supporting substrate.

The nitrogen ratio of the piezoelectric material layer-side intermediate layer may preferably be 25 or higher and 50 or lower, and more preferably be 27 or higher and 43 or lower, provided that 100 is assigned to the nitrogen ratio of the supporting substrate. Further, the nitrogen ratio of the piezoelectric material layer-side intermediate layer may preferably be lower than the nitrogen ratio of the interface layer, and a difference between the two may preferably be 25 or larger.

The oxygen ratio of the supporting substrate-side intermediate layer may preferably be 102 or higher and 130 or lower, and more preferably be 111 or higher and 117 or lower, provided that 100 is assigned to the oxygen ratio of the supporting substrate.

The oxygen ratio of the interface layer may preferably be 130 or higher and 180 or lower, and more preferably be 148 or higher and 165 or lower, provided that 100 is assigned to the oxygen ratio of the supporting substrate.

The oxygen ratio of the piezoelectric material layer-side intermediate layer may preferably be 198 or higher and 230 or lower, and more preferably be 202 or higher and 208 or lower, provided that 100 is assigned to the oxygen ratio of the supporting substrate.

The aluminum ratio of the supporting substrate-side intermediate layer may preferably be 80 or higher and 98 or lower, and more preferably be 87 or higher and 88 or lower, provided that 100 is assigned to the aluminum ratio of the supporting substrate.

The aluminum ratio of the interface layer may preferably be 29 or higher and 51 or lower, and more preferably be 39 or higher and 41 or lower, provided that 100 is assigned to the aluminum ratio of the supporting substrate.

The aluminum ratio of the piezoelectric material layer-side intermediate layer may preferably be 16 or higher and 29 or lower, and more preferably be 17 or higher and 19 or lower, provided that 100 is assigned to the aluminum ratio of the supporting substrate.

The silicon ratio of the supporting substrate-side intermediate layer may preferably be 80 or higher and 120 or lower, and more preferably be 97 or higher and 110 or lower, provided that 100 is assigned to the silicon ratio of the supporting substrate.

The silicon ratio of the interface layer may preferably be 1 or higher and 20 or lower, and more preferably be 1 or higher and 3 or lower, provided that 100 is assigned to the silicon ratio of the supporting substrate.

One or more element(s) (A) selected from the group consisting of niobium and tantalum diffuses from the piezoelectric material layer to the supporting substrate. Thus, the atomic ratio of the element (A) of the interface layer may preferably be 85 to 97 and more preferably be 90 to 92, provided that 100 is assigned to the atomic ratio of the element (A) of the piezoelectric material layer. Further, the atomic ratio of the element (A) of the supporting substrate-side intermediate layer may preferably be 4 to 29 and more preferably be 6 to 11. Further, the atomic ratio of the element (A) of the supporting substrate-side intermediate layer is usually lower than the atomic ratio of the element (A) of the interface layer.

For example, the atomic ratio of a carrier gas such as argon (Ar) of the interface layer may preferably be 2 to 4 atom %. Further, the atomic ratio of a carrier gas such as argon (Ar) of the supporting substrate-side intermediate layer may preferably be 2 to 5 atom %. Further, the atomic ratio of a carrier gas such as argon (Ar) of the piezoelectric material layer-side intermediate layer may preferably be 4 to 8 atom %.

Preferred production examples of the bonded body of the present invention will be described below.

FIGS. 4 and 5 are diagrams for illustrating a production example of directly bonding a supporting substrate onto a surface of the piezoelectric material layer.

Figure 4A:
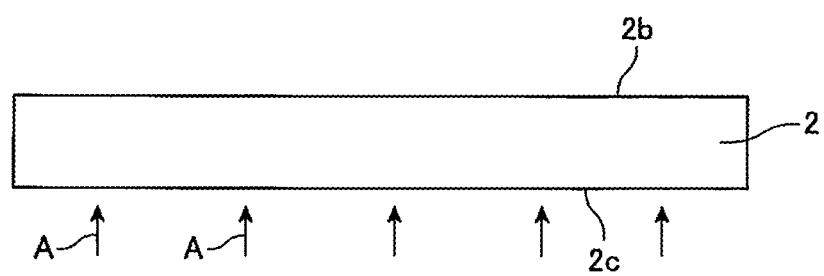
FIG. 4 (a) shows the state that a surface 2c of a piezoelectric material layer 2 is activated by neutralized beam A.
FIG. 4(b) shows the state that a surface 3c of a supporting substrate 3 is activated by neutralized beam A.

As shown in FIG. 4(a), neutralized beam is irradiated onto a surface 2c of a piezoelectric material layer 2 according to the arrows A to activate the surface of the piezoelectric material layer 2 to provide an activated surface.

Figure 4B:
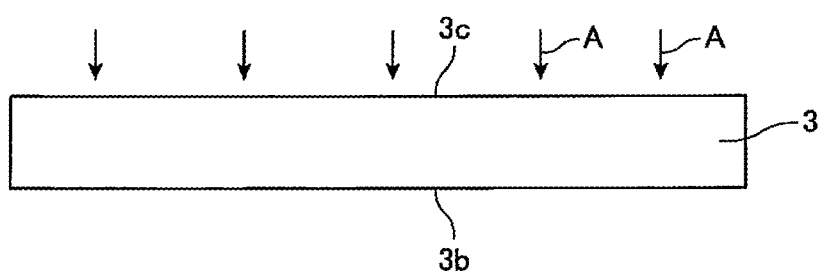
Figure 5A:
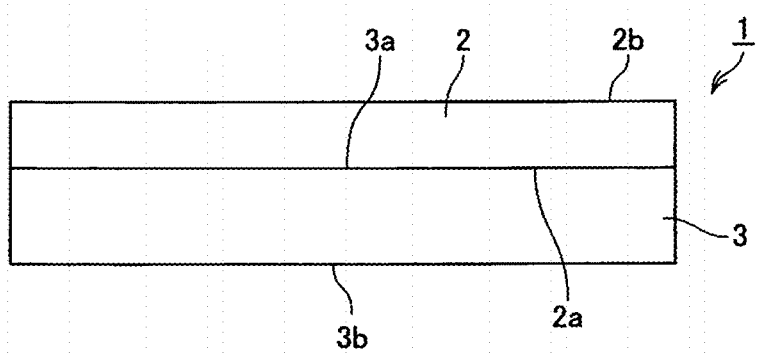
FIG. 5(a) shows the state that the piezoelectric material layer 2 and supporting substrate 3 are bonded with each other.

Further, as shown in FIG. 4(b), neutralized beam A is irradiated onto the surface 3c of the supporting substrate 3 to activate it so that the supporting substrate is provided with an activated surface formed thereon. Then, as shown in FIG. 5(a), the activated surface 2a of the piezoelectric material layer 2 and the activated surface 3a of the supporting body 3 are bonded by direct bonding to obtain a bonded body 1.

Figure 5B:
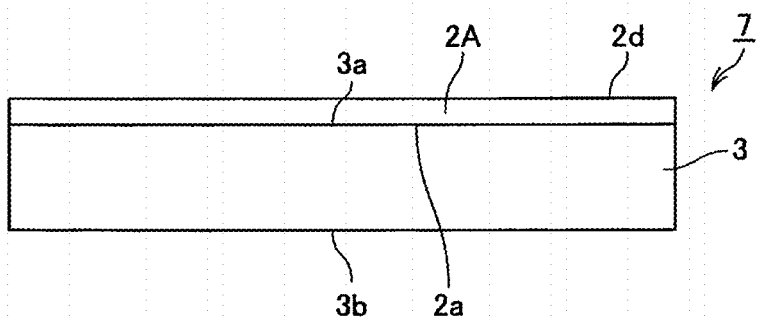
FIG. 5(b) shows the state that a piezoelectric material layer 2A is thinned by processing.

According to a preferred embodiment, the surface 2b of the piezoelectric material layer 2 of the bonded body 1 is further subjected to polishing process to make the thickness of the piezoelectric material layer 2A smaller as shown in FIG. 5(b) to obtain a bonded body 7. 2d represents a polished surface.

Figure 5C:
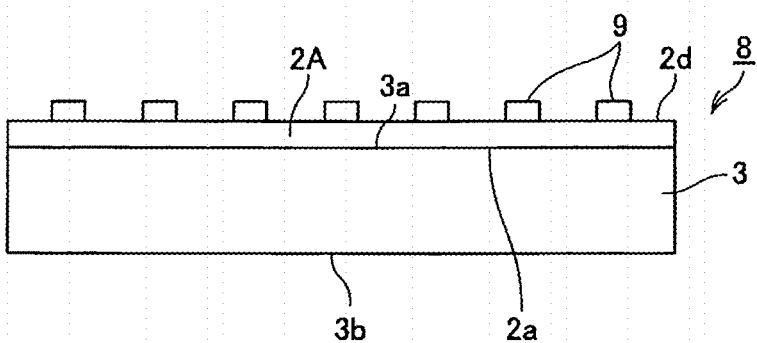
FIG. 5(c) shows the state that an electrode 9 is provided on the piezoelectric material layer 2A.

In FIG. 5(c), predetermined electrodes 9 are formed on the polished surface 2d of the piezoelectric material layer 2A to produce a surface acoustic wave device 8.

The respective constituents of the present invention will be further described below.

Applications of the bonded body of the present invention are not particularly limited, and the bonded body may be appropriately applied to an acoustic wave device and optical device, for example.

Known acoustic wave devices include a surface acoustic wave device, Lamb wave-type device, thin film resonator (FBAR) or the like. For example, the surface acoustic wave device is produced by providing input side IDT (Interdigital transducer) electrodes (also referred to as comb electrodes or interdigitated electrodes) for oscillating surface acoustic wave and an IDT electrode on the output side for receiving the surface acoustic wave on the surface of the piezoelectric material layer. By applying high frequency signal on the IDT electrode on the input side, an electric field is generated between the electrodes so that the surface acoustic wave is oscillated and propagated on the piezoelectric material layer. Then, the propagated surface acoustic wave can be drawn as an electrical signal from the IDT electrodes on the output side, which is provided in the direction of the propagation.

A metal film may be provided on a bottom surface of the piezoelectric material layer. After the lamb type device is produced as the acoustic wave device, the metal film plays a role of improving the electro-mechanical coupling factor near the bottom surface of the piezoelectric substrate. In this case, the Lamb type device has the structure that interdigitated electrodes are formed on the surface of the piezoelectric material layer and that the metal film on the piezoelectric material layer is exposed through a cavity provided in the supporting substrate. The material of such metal film includes aluminum, an aluminum alloy, copper, gold or the like, for example. Further, when the Lamb wave device is produced, it may be used a composite substrate having the piezoelectric material layer without the metal film on the bottom surface.

Further, a metal film and an insulating film may be provided on the bottom surface of the piezoelectric material layer. The metal film plays a role of electrodes when the thin film resonator is produced as the acoustic wave device. In this case, the thin film resonator has the structure where electrodes are formed on the upper and bottom surfaces of the piezoelectric material layer and the insulating film is formed as a cavity to expose the metal film on the piezoelectric material layer. The material of such metal film includes molybdenum, ruthenium, tungsten, chromium, aluminum or the like, for example. Further, the material of the insulating film includes silicon dioxide, phosphorus silicate glass, boron phosphorus silicate glass or the like.

Further, the optical device may be an optical switching device, wavelength conversion device and optical modulating device. Further, a periodic domain inversion structure may be formed in the piezoelectric material layer.

When the object of the present invention is a surface acoustic wave device and the material of the piezoelectric material layer is lithium tantalate, the layer in which the direction of propagation of surface acoustic wave is rotated in an angle of 36 to 47° (for example 42°) from the Y-axis toward the Z-axis around the X-axis due to the low propagation loss may preferably be used.

Further, when the piezoelectric material layer is composed of lithium niobate, the layer in which the direction of propagation of surface acoustic wave is rotated in an angle of 60 to 68° (for example 64°) from the Y-axis toward the Z-axis around the X-axis due to the low propagation loss may preferably be used. Further, although the size of the piezoelectric material layer is not particularly limited, the diameter is 50 to 150 mm and the thickness is 0.2 to 60 μm, for example.

The following method is preferred for obtaining the bonded body of the present invention.

First, the surfaces (bonding surfaces) of the piezoelectric material layer and supporting substrate are flattened to obtain flat surfaces. Here, the method of flattening each of the surfaces includes lapping, chemical mechanical polishing or the like. Further, the flat surface may preferably have Ra of 1 nm or less and more preferably have Ra of 0.3 nm or less.

Then, the surfaces of the piezoelectric material layer and supporting substrate are cleaned to remove the residue of the abrasive. The method of cleaning the surfaces includes wet cleaning, dry cleaning, scrub cleaning or the like, and scrub cleaning is preferred for obtaining cleaned surfaces easily and efficiently. At this time, it is particularly preferred to use "Semi Clean M-LO" as cleaning liquid, followed by cleaning by means of a scrub cleaning system using a mixed solvent of acetone and IPA.

A neutralized beam is then irradiated onto the surfaces of the piezoelectric material layer and supporting substrate to activate the respective flat surfaces.

When a neutralized beam is used to perform the surface activation, it is preferred to use a system described in patent document 4 to generate the neutralized beam which is then irradiated. That is, a high-speed saddle field type atomic beam source is used as the beam source. Inert gas is then introduced into a chamber and a high voltage is applied onto electrodes from a direct current electric source. Thus, an saddle-field type electric field is generated between the electrode (positive electrode) and a housing (negative electrode), so that electrons e are moved to generate beams of atoms and ions from the inert gas. Among the beams reaching a grid, the ion beam is neutralized at the grid so that the beam of neutral atoms is emitted from the high-speed atomic beam source. The atomic species forming the beam may preferably be that of an inert gas (argon, nitrogen or the like).

The voltage and current at the time of activation by irradiation of the beam may preferably be made 0.5 to 2.0 kV and 50 to 200 mA, respectively.

Then, the activated surfaces are contacted and bonded with each other under a vacuum atmosphere. This process is performed under an ambient temperature, which is preferably 40° C. or lower and more preferably 30° C. or lower. The temperature during the bonding step may preferably be 20° C. or higher and more preferably be 25° C. or lower. The pressure during the bonding step may preferably be 100 to 20000N.

EXAMPLES

Comparative Example 1

The bonded body was obtained according to the method described referring to FIGS. 4 and 5.
Specifically, the piezoelectric material layer 2 of lithium tantalate (LT) having an orientation flat (OF) part, a diameter of 4 inches and thickness of 250 µm was prepared. As the piezoelectric material layer 2, a 46° Y-cut X-propagation LT substrate was used in which the direction of propagation of the surface acoustic wave (SAW) is X and the Y-cut plate is rotated in a cutting angle. The surface 2c of the piezoelectric material layer 2 was mirror-polished to an arithmetic average roughness Ra of 1 nm.

Further, as the supporting substrate 3, a sialon substrate having an OF part, a diameter of 4 inches, and a thickness of 230 µm, was prepared. The sialon has a composition of $Si_{6-z}Al_zO_zN_{8-z}$ (z=2.5). The surfaces 3c of the supporting substrate 3 of sialon had an arithmetic average roughness Ra of 2 nm. The arithmetic average roughness was evaluated by means of an atomic force microscope (AFM) in a square visual field of a length of 10 µm and a width of 10 µm.

The supporting substrate 3 was then cleaned by a scrub cleaner. "Semi Clean M-LO", and then a mixed solution of acetone and IPA, were used as cleaning liquids. The supporting substrate 3 and piezoelectric material layer 2 were then introduced into a vacuum chamber. The interior was drawn to a vacuum of an order of $10^{-6}$ Pa, and a high-speed atomic beam (at an acceleration voltage of 0.5 kV and a flow rate of Ar of 27 sccm) was irradiated onto each of the bonding surfaces of the substrates over 120 sec. The beam irradiated surface (activated surface) 2a of the piezoelectric material layer 2 and the activated surface 3a of the supporting substrate 3 were then contacted with each other, followed by applying pressure at 10000N over 2 minutes to bond the substrates (FIG. 5(a)).

The bonded body thus obtained was then subjected to the measurement of the respective atomic ratios of nitrogen (N), oxygen (O), aluminum (Al), silicon (Si), tantalum (Ta) and argon (Ar) of the piezoelectric material layer, piezoelectric material layer-side intermediate layer, interface layer, supporting substrate-side intermediate layer and supporting substrate, respectively. The results are shown in Table 1.

Further, Comparative Example 1 is outside of the scope of the present invention, as silicon is not contained in the interface layer.

Further, the bonded body thus obtained was subjected to evaluation of bonding strength by a crack-opening method, whereby a value of 0.5 J/m² was obtained. Further, the surface 2b of the piezoelectric material layer 2 was ground and polished so that the thickness was changed from the initial 250 µm to 30 µm. The peeling of the bonded part occurred during the grinding and polishing steps.

TABLE 1

| | Comparative Example 1 | | | | | |
|---|---|---|---|---|---|---|
| Unit | N | O | Al | Si | Ta | Ar |
| | | Relative ratio | | | | atom % |
| Piezoelectric material layer | 0 | 268 | 0 | 0 | 100 | 0 |
| Piezoelectric material layer-side Intermediate layer | 24 | 197 | 15 | 0 | 95 | 8.9 |
| Interface layer | 34 | 188 | 27 | 0 | 100 | 4.1 |
| Supporting substrate-side Intermediate layer | 46 | 131 | 76 | 78 | 30 | 5.2 |
| Supporting substrate | 100 | 100 | 100 | 100 | 0 | 0 |

Inventive Example 1

The bonded body was produced according the same procedure as Comparative Example 1. However, the acceleration voltage irradiated onto the bonding surfaces of the substrates during the bonding was changed to 0.6 kV.

The bonded body thus obtained was then subjected to the measurement of the respective atomic ratios of oxygen (O), aluminum (Al), silicon (Si), tantalum (Ta), argon (Ar) and nitrogen (N) of the piezoelectric material layer, piezoelectric material substrate-side intermediate layer, interface layer, supporting substrate-side intermediate layer and supporting substrate, respectively. The results are shown in Table 2.

TABLE 2

| | Inventive Example 1 | | | | | |
|---|---|---|---|---|---|---|
| Unit | N | O | Al | Si | Ta | Ar |
| | | Relative ratio | | | | atom % |
| Piezoelectric material layer | 0 | 275 | 0 | 0 | 100 | 0 |
| Piezoelectric material layer-side Intermediate layer | 39 | 203 | 19 | 0 | 90 | 6.8 |
| Interface layer | 50 | 166 | 44 | 5 | 93 | 3.3 |
| Supporting substrate-side Intermediate layer | 60 | 115 | 87 | 100 | 10 | 4.1 |
| Supporting substrate | 100 | 100 | 100 | 100 | 0 | 0 |

Further, the bonded body thus obtained was subjected to an evaluation of bonding strength by a crack-opening method, whereby a value of 0.75 J J/m² was obtained. Further, the surface 2b of the piezoelectric material layer 2 was ground and polished so that the thickness was changed from the initial 250 µm to 30 µm. The peeling of the bonded part did not occur during the grinding and polishing steps. Upon further grinding and polishing to a thickness of 20 µm, the peeling of the bonded part occurred during the grinding and polishing steps.

Inventive Examples 2 to 4

The bonded bodies were produced according the same procedure as Comparative Example 1. However, the acceleration voltages irradiated onto the bonding surfaces of the substrates during the bonding were changed to 1.0 kV, 1.2 kV and 1.5 kV in Inventive Examples 2, 3 and 4, respectively.

The bonded bodies thus obtained were then subjected to the measurement of the respective atomic ratios of nitrogen (N), oxygen (O), aluminum (Al), silicon (Si), tantalum (Ta) and argon (Ar) of the piezoelectric material layer, piezoelectric material layer-side intermediate layer, interface layer, supporting substrate-side intermediate layer and supporting substrate, respectively. The results are shown in Tables 3, 4 and 5.

Further, the bonded bodies thus obtained were subjected to an evaluation of bonding strength by a crack-opening method, whereby bulk fracture occurred in the all of the bonded bodies. Further, the surfaces 2b of the piezoelectric material layers 2 were ground and polished so that the thicknesses were changed from the initial 250 μm to 20 μm. The peeling of the bonded part did not occur during the grinding and polishing steps.

TABLE 3

Inventive Example 2

| Unit | N | O | Al | Si | Ta | Ar |
|---|---|---|---|---|---|---|
| | Relative ratio | | | | | atom % |
| Piezoelectric material layer | 0 | 265 | 0 | 0 | 100 | 0 |
| Piezoelectric material layer-side Intermediate layer | 27 | 208 | 19 | 0 | 87 | 7.9 |
| Interface layer | 76 | 148 | 41 | 2 | 91 | 3.0 |
| Supporting substrate-side Intermediate layer | 56 | 111 | 88 | 110 | 6 | 4.0 |
| Supporting substrate | 100 | 100 | 100 | 100 | 0 | 0 |

TABLE 4

Inventive Example 3

| Unit | N | O | Al | Si | Ta | Ar |
|---|---|---|---|---|---|---|
| | Relative ratio | | | | | atom % |
| Piezoelectric material layer | 0 | 278 | 0 | 0 | 100 | 0 |
| Piezoelectric material layer-side Intermediate layer | 43 | 202 | 18 | 0 | 91 | 6.4 |
| Interface layer | 68 | 165 | 39 | 3 | 90 | 3.4 |
| Supporting substrate-side Intermediate layer | 61 | 117 | 87 | 97 | 11 | 4.1 |
| Supporting substrate | 100 | 100 | 100 | 100 | 0 | 0 |

TABLE 5

Inventive Example 4

| Unit | N | O | Al | Si | Ta | Ar |
|---|---|---|---|---|---|---|
| | Relative ratio | | | | | atom % |
| Piezoelectric material layer | 0 | 271 | 0 | 0 | 100 | 0 |
| Piezoelectric material layer-side Intermediate layer | 35 | 205 | 19 | 0 | 89 | 7.2 |
| Interface layer | 72 | 157 | 40 | 3 | 90 | 3.2 |
| Supporting substrate-side Intermediate layer | 58 | 114 | 87 | 103 | 9 | 4.0 |
| Supporting substrate | 100 | 100 | 100 | 100 | 0 | 0 |

The invention claimed is:

1. A bonded body comprising a supporting substrate and a piezoelectric material layer, said supporting substrate comprising sialon, and said piezoelectric material layer comprising a material comprising LiAO$_3$ (A represents one or more element selected from the group consisting of niobium and tantalum), wherein
    said bonded body comprises an interface layer present along an interface between said supporting substrate and said piezoelectric material layer and a supporting substrate-side intermediate layer present between said interface layer and said supporting substrate, and
    each of said interface layer and said supporting substrate-side intermediate layer comprises nitrogen, oxygen, aluminum, silicon and one or more element selected from the group consisting of niobium and tantalum.

2. The bonded body of claim 1, wherein said interface layer has a nitrogen ratio higher than a nitrogen ratio of said supporting substrate-side intermediate layer.

3. The bonded body of claim 1, wherein said interface layer has said nitrogen ratio of 51 or higher and 93 or lower, provided that 100 is assigned to a nitrogen ratio of said supporting substrate.

4. The bonded body of claim 3, wherein said interface layer has said nitrogen ratio of 60 or higher and 84 or lower, provided that 100 is assigned to said nitrogen ratio of said supporting substrate.

5. The bonded body of claim 4, wherein said interface layer has said nitrogen ratio of 68 or higher and 76 or lower, provided that 100 is assigned to said nitrogen ratio of said supporting substrate.

6. The bonded body of claim 1, wherein sialon constituting said supporting substrate has a composition of $Si_{6-z}Al_zO_zN_{8-z}$ (z is 0.5 or higher and 4.0 or lower).

7. An acoustic wave device comprising:
    said bonded body of claim 1; and
    an electrode provided on said piezoelectric material layer.

* * * * *